United States Patent [19]
Kobayashi

[11] Patent Number: 5,559,472
[45] Date of Patent: Sep. 24, 1996

[54] LOSS COMPENSATED GAIN CELL FOR DISTRIBUTED AMPLIFIERS

[75] Inventor: Kevin W. Kobayashi, Torrance, Calif.

[73] Assignee: TRW Inc., Redondo Beach, Calif.

[21] Appl. No.: 433,266

[22] Filed: May 2, 1995

[51] Int. Cl.[6] ............................... H03F 1/34; H03F 3/19
[52] U.S. Cl. ................ 330/293; 330/54; 330/296; 330/311
[58] Field of Search ............... 330/54, 293, 296, 330/310, 311

[56] References Cited

U.S. PATENT DOCUMENTS

| | | | |
|---|---|---|---|
| 3,582,800 | 6/1971 | Lehman et al. | 330/293 |
| 3,628,166 | 12/1971 | Harford | 330/293 X |
| 3,805,164 | 4/1974 | Callaway . | |
| 4,220,932 | 9/1980 | Engel . | |
| 4,484,147 | 11/1984 | Metz | 330/291 X |
| 4,496,908 | 1/1985 | Takano et al. | 330/293 X |
| 4,752,746 | 6/1988 | Niclas . | |
| 4,992,752 | 2/1991 | Cioffi . | |
| 5,012,203 | 4/1991 | Beyer et al. . | |
| 5,046,155 | 9/1991 | Beyer et al. . | |
| 5,047,732 | 9/1991 | Tanaami et al. . | |
| 5,066,926 | 11/1991 | Ramachandran et al. . | |
| 5,105,167 | 4/1992 | Peczalski . | |
| 5,177,381 | 1/1993 | Friesen et al. . | |
| 5,227,734 | 7/1993 | Schindler et al. . | |
| 5,252,931 | 10/1993 | Nishiyama . | |
| 5,274,342 | 12/1993 | Wen et al. . | |
| 5,361,038 | 11/1994 | Allen et al. . | |

FOREIGN PATENT DOCUMENTS 675583  8/1979  U.S.S.R. ................................. 330/54

OTHER PUBLICATIONS

S. Deible, and J. B. Beyer, "Attenuation Compensation in Distributed Amplifier Design," IEEE trans. on Microwave Theory and Techniques, vol. 37, No. 9, pp. 1425–1433, 1989.
K. W. Kobayashi, et al., "A Novel HBT Distributed Amplifier Design Topology based on Attenuation Compensation Techniques," in IEEE Microwave Millimeter–Wave Monolithic Circuits Digest, May 23, 1994.
Bartram, "Bias Supply for R.F. Power Amplifiers", *Wireless World*, Apr. 1976, p. 61, vol. 82, No. 1484.

*Primary Examiner*—James B. Mullins
*Attorney, Agent, or Firm*—Michael S. Yatsko

[57] ABSTRACT

An amplifier includes an amplifier input and an amplifier output. A gain cell is coupled between the amplifier input and the amplifier output and provides gain. The gain cell includes an input device to the amplifier input for reducing input capacitance and resistive losses, and an output device coupled to the amplifier output for reducing output resistive losses. The gain cell can further include a feedback device coupled to the gain cell output for stabilizing the gain cell. The gain cell input includes a common-collector bipolar transistor and the gain cell output includes a common-base bipolar transistor in series with a common-emitter bipolar transistor. Because of the low input and output resistive losses and a low input capacitance, the gain cell can be incorporated into a distributed amplifier having numerous stages without decreasing gain or bandwidth performance.

31 Claims, 8 Drawing Sheets

IP3 AT VARIOUS BIAS CURRENTS

LOSS COMPENSATED GAIN CELL FOR DISTRIBUTED AMPLIFIERS

BACKGROUND OF THE INVENTION

1. Technical Field

This invention relates to gain cells and, more particularly, to gain cells with internal loss-compensation which can be employed in distributed amplifiers and other circuits.

2. Discussion

In practice, three terminal semiconductor devices such as silicon bipolar junction transistors (BJTs), metal-oxide semiconductor field effect transistors (MOSFETs), and their gallium arsenide (GaAs) and indium phosphide (InP)-based counterparts, hetero-junction bipolar technology (HBTs), metal semiconductor field effect transistor (MESFETs), and high electron mobility transistors (HEMTs), have significant performance limitations when used as gain cells in distributed amplifiers and other circuits due to intrinsic properties thereof. These types of devices have finite series and/or shunt resistances associated with each of their terminals which attenuate the power of an input signal delivered to the intrinsic device or limit the power delivered from the device to a load. In general, these device resistive losses can significantly limit the maximum gain and output power available from the device when used as a gain cell.

A distributed amplifier typically includes a signal input, a signal output, and two or more gain cells each having an input connected to the signal input and an output connected to the signal output. Preferably, each additional gain cell increases the gain and/or bandwidth of the distributed amplifier incrementally. The distributed amplifier is of particular interest because its fundamental gain-bandwidth performance limit is determined by the properties of the gain cell employed. Two main device characteristics that limit the gain-bandwidth performance of the distributed amplifier: 1) high input capacitance, and 2) the resistive losses of the input and output of a common-source/emitter configured device. The first limitation can be circumvented using capacitive coupling techniques, scaling the device size and/or choosing an optimum device quiescent bias, or intrinsic device enhancements. But for a given device size, bias and effective input capacitance, the device resistances and losses associated therewith cannot practically be reduced because they are a result of the fundamental limitation of the device and fabrication technology. The resistive losses of the input and output transmission lines of the distributed amplifier, due to these parasitic and intrinsic device characteristics, limit the number of stages which can ultimately be added to achieve increased amplifier output power. At some point, adding additional stages degrades the bandwidth without increasing the gain and output power. Therefore, a gain cell which has lower input capacitance and compensation for resistive losses is desirable in distributed amplifiers. Furthermore, a distributed amplifier employing gain cells with compensated resistive losses to allow an increased number of stages to be added without degradation of gain and bandwidth performance is also desirable.

Because of the fundamental differences in bipolar and field effect transistor device physics and fabrication technology, bipolar devices, and in particular, HBT devices, will suffer from larger resistive attenuation degradation in distributed amplifiers due to their generally more resistively lossy device input characteristics. Thus, it would be particularly desirable to provide enhanced gain, bandwidth, and output power of distributed amplifiers using BJTs, and in particular, HBTs.

Therefore, a gain cell using bipolar transistors which has lower input capacitance and compensation for resistive losses is desirable. Further, a distributed amplifier employing bipolar gain cells with compensated resistive losses to allow an increased number of stages to be added without degradation of gain and bandwidth performance is also desirable.

SUMMARY OF THE INVENTION

In accordance with the teachings of the present invention, a gain cell circuit is provided which is internally loss-compensated, that is, it as the properties of low-loss input and output characteristics as well as enhanced gain characteristics which can improve the gain-bandwidth product of an amplifier by as much as 200 percent. The invention can be equally employed with various three-terminal semiconductor devices and generally applied to a wide range of amplifiers such as transimpedance amplifiers, power amplifiers, feedback amplifiers and the like and especially to distributed amplifiers.

An amplifier, according to the invention, includes an amplifier input and an amplifier output. A gain cell is coupled between the amplifier input and the amplifier output and provides gain. The gain cell includes an input device, coupled to the amplifier input, for reducing input capacitance and resistive losses. An output device is coupled to the amplifier output and reduces output resistive losses.

In another feature of the invention, the amplifier is a distributed amplifier with a plurality of gain cells.

According to one feature of the invention, the gain cell further includes a feedback device, associated with the output device, for stabilizing the gain cell.

According to still another feature of the invention, the input device includes a common-collector bipolar transistor having a base coupled to the amplifier input. The output device includes a common-base bipolar transistor in series with a common-emitter bipolar transistor.

In accordance with the teachings of the present invention, a bipolar transistor (BT) gain cell according to a particular example of the present invention has low input and output loss through input and out put attenuation compensation. The BT gain cell includes an input and a first BT having a base, a collector and an emitter. The input is coupled to the base of the first BT. A second BT has a base, a collector and an emitter. A third BT has a base, a collector and an emitter. The second and third BT's are connected in a cascode configuration. The emitter of the first BT is coupled to the base of the second BT. An output is coupled to the collector of the third BT.

According to one feature of the invention, a first bias resistor has one end coupled to the base of the second BT and an opposite coupled to ground. The first bias resistor provides a current sink for the first BT.

According to another feature of the invention, a feedback device coupled to the base and collector of the third BT stabilizes the second BT and the third BT. The feedback device includes a feedback resistor having a first end coupled to the collector of the third BT and an opposite end coupled to the base of the third BT. The feedback device further includes a second bias resistor having a first end coupled to the base of the third BT and an opposite end coupled to ground. The second bias resistor provides a partial voltage bias to the base of the third BT. The feedback device further includes a biasing capacitor having one end coupled to the base of the third BT transistor. A third biasing resistor has one end coupled to an opposite end of the biasing capacitor and an opposite end coupled to ground.

Still other objects, features and advantages will be readily apparent.

BRIEF DESCRIPTION OF THE DRAWINGS

The various advantages of the present invention will become apparent to those skilled in the art after studying the following specification and by reference to the drawings in which.

DETAILED DESCRIPTION

Figure 8:
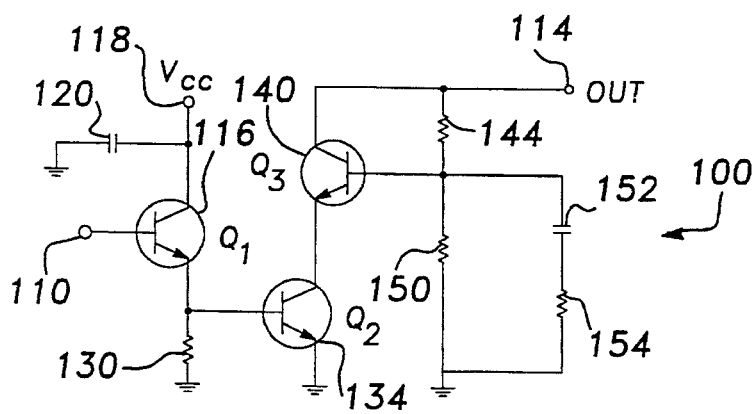
FIG. 8 is an electrical schematic of a bipolar transistor gain cell according to the invention.
Figure 14:
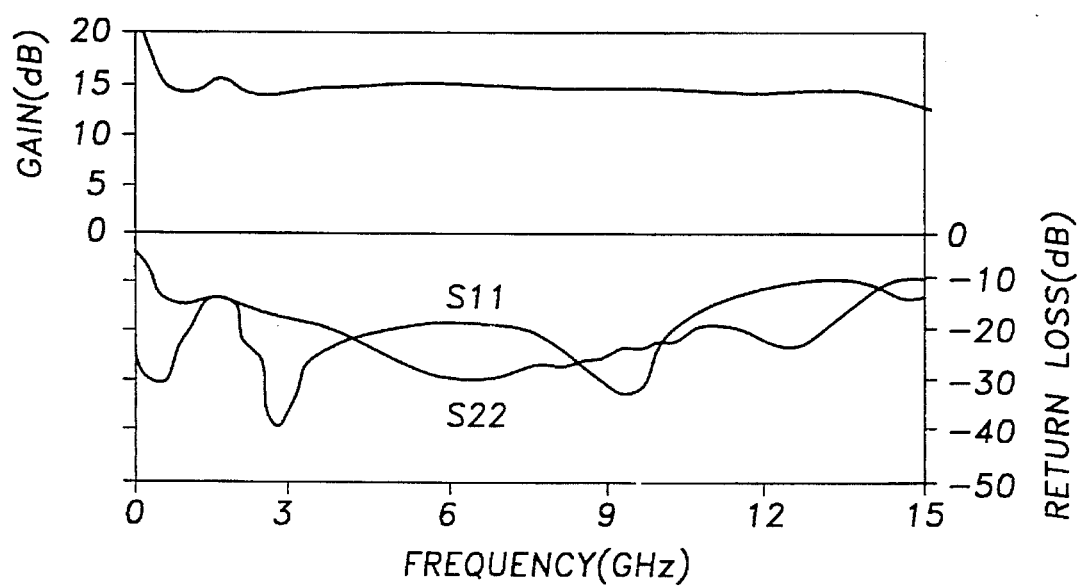
FIG. 14 illustrates measured wideband gain and input/output return/loss response of the gain cell of FIG. 8.
Figure 15:
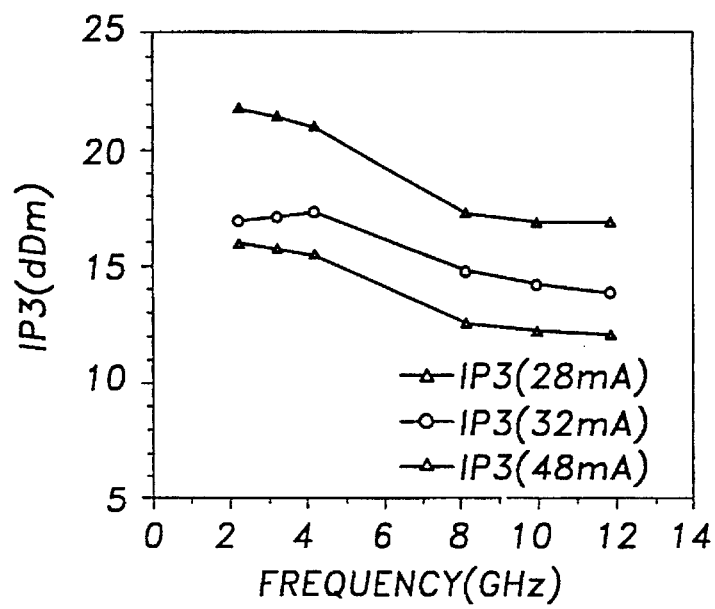
FIG. 15 illustrates measured wideband IP3 performance under different bias conditions for the gain cell of FIG. 8.
Figure 16:
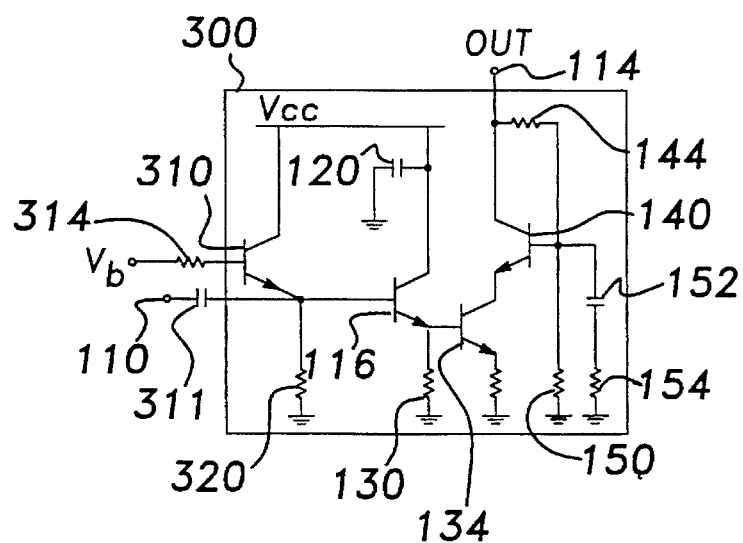
FIG. 16 illustrates a bipolar gain cell according to a second embodiment of the present invention.
Figure 17:
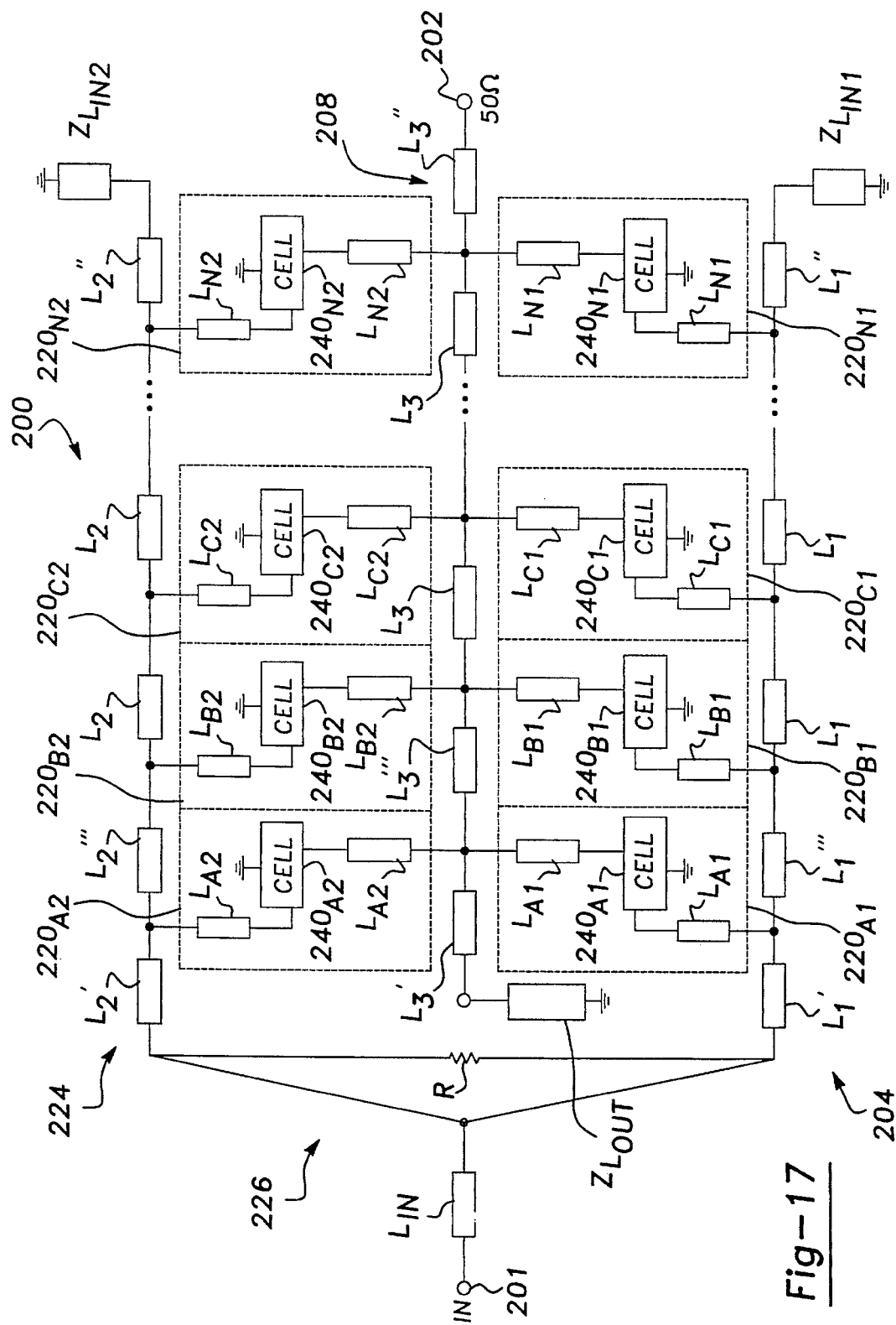
FIG. 17 illustrates the gain cells of FIGS. 8 and 16 configured in a distributed amplifier.

FIGS. 1–6 illustrate the prior art add/or conceptual schematics which help describe the development of the invention including the novel bipolar transistor gain cells shown in FIGS. 8 and 16 and the novel distributed amplifier of FIG. 17 incorporating the gain cells of FIGS. 8 and 16. FIGS. 9–15 illustrate the improved performance of the bipolar gain cells of FIGS. 8 and 16 over conventional gain cells. It should be understood, however, that while this invention will be described in connection with certain particular examples that these examples are set forth merely for illustrative purposes and that the scope of the present invention is not limited to these examples, as will become apparent to those skilled in the art.

HBT distributed amplifier gain-bandwidth performance is limited by several factors which parallel HEMT and MESFET DA design. Input capacitance $C_\pi$ ($C_{gs}$) limits the ultimate bandwidth cut-off frequency of the HBT DA. The input transmission line attenuation factor $A_g$, which is dominated by input device losses, and the output transmission line attenuation factor $A_d$ limit the number of sections that can be added to increase the gain-bandwidth performance and output power capability of the DA.

Device input capacitance $C_\pi$ ($C_{gs}$) determines the maximum input transmission line cut-off frequency as follows:

$$f_{ci} = \frac{1}{\Pi * \sqrt{C_\Pi * L_B}} \quad (1)$$

HBT input capacitances are usually an order of magnitude larger than FET devices for the same operating current. The input capacitance $C_\pi$ of the HBT transistor includes a depletion capacitance term and a diffusion capacitance term. The input capacitance of a FET includes a depletion term only.

The HBT diffusion capacitance strongly depends on device collector current and dominates the input capacitance. The input capacitance is expressed as:

$$C_\Pi = C_{be} + G_m * (\tau_B + \tau_C) = C_{be} + \frac{I_c q}{n * KT} * (\tau_B + \tau_C) \quad (2)$$

where $C_{be}$ is the depletion capacitance of the base-emitter junction, $I_c$ is the collector bias current, and $\tau_B$ and $T_c$ are the transit times through the base and collector, respectively.

Reducing device size and collector current to reduce the input capacitance sacrifices gain, which is strongly dependent on collector current, and increases input line attenuation due to the increase in base resistance $R_b$.

Input transmission line attenuation results from passive microstrip line loss and the device input impedance characteristics. Lossy input characteristics of the HBT device dominate the attenuation of the input transmission line of the DA. A relatively large base resistance $R_b$ of the HBT (approximately 10–50 ohms) causes part of the input loss (FET $R_g$ is ≈1–6 ohms at the same bias current). In addition, the input shunt resistance $R_\pi$ is approximately 100–500 ohms as compared to a FET which is effectively infinite.

Input line attenuation from HBT device resistances reduces the number of sections that can be added to obtain higher gain-bandwidth. For HBT DA's, the input line attenuation affects bandwidth performance as much as the input capacitance. Techniques such as negative attenuation compensation would greatly improve the HBT DA gain-bandwidth product by allowing more active DA sections.

Output transmission line attenuation is affected by the finite output conductance of the HBT device Increasing the output conductance increases attenuation on the output transmission lines. HBT transistors typically have very low output conductances $G_o$ (high output shunt resistance $r_o$). The output resistance of the HBT transistor, approximately 10–90 kilo-ohms, is much higher than FET output resistance, approximately a few hundred ohms. For this reason, the output line attenuation caused by HBT collector loading has less effect on DA performance than attenuation caused by the drain loading of a FET.

Each of these factors is important to HBT DA gain-bandwidth performance. Several FET DA circuit techniques for increasing the gain and bandwidth have been applied to HBT DA: capacitive coupling; device bias and geometry scaling; modifying the MBE structure to reflect a smaller input capacitance; and, matrix distributed amplifier approaches. Most of these techniques involve reducing the input capacitance. However, the HBT DA is influenced greatly by the input line attenuation due to the lossy characteristics. The attenuation compensation design according to the invention improves gain-bandwidth product by as much as 200% over a conventional HBT DA implementation.

Figure 1:
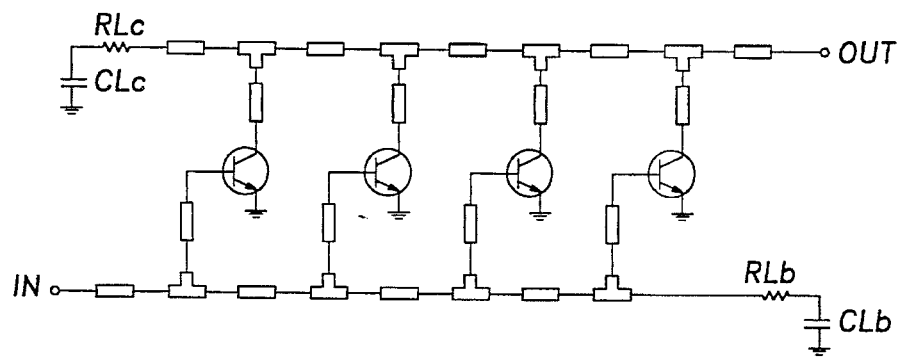
FIG. 1 is an electrical schematic of a common-emitter distributed amplifier employing bipolar transistors according to the prior art.
Figure 2:
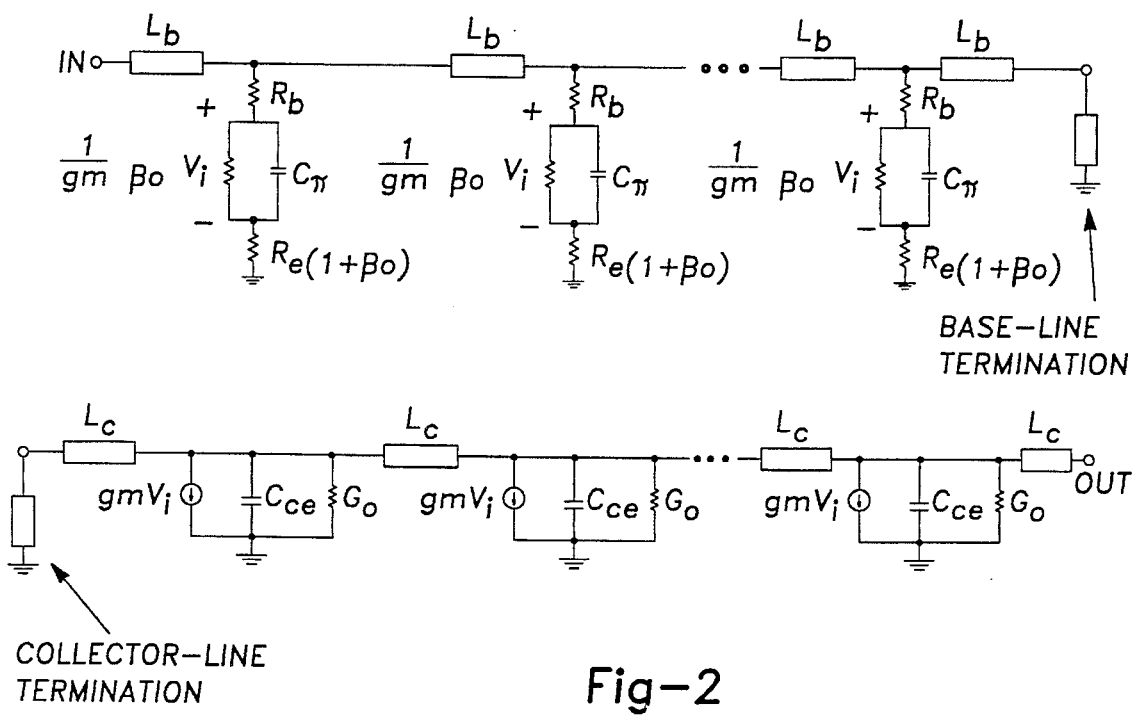
FIG. 2 is an electrical schematic of synthesized distributed input and output transmission lines using bipolar transistors.

FIG. 1 is a schematic of a conventional common-emitter distributed amplifier. The HBT transistors employed therein are periodically spaced and may be qualitatively described as a set of artificial input and output transmission lines coupled by the HBT transconductance. FIG. 2 shows the synthesized input and output transmission lines using HBT devices. The input transmission line of the HBT DA is periodically loaded by the base of the HBT and is represented by a series base resistance $R_b$ and a shunt R-C network. The R-C shunt network includes resistance $R_\pi$ and capacitor $C_\pi$ in series with an emitter resistance $R_e$. The output line is loaded by the collector output conductance $G_o$ ($1/r_o$) of the HBT. The input and output lines are coupled by the device transconductance. The resistances ($R_b$, $R_\pi$, and $R_e$) all contribute losses which result in input line attenuation. For a simple lossy transmission line model, the attenuation factor can be represented by the following equation:

$$\alpha_i \approx \frac{1}{2}\left[\frac{Z_o}{R_e' + R_b' + \left[|\beta(\omega)| * \left(\frac{1}{g_m} + R_e'\right)\right]} + \frac{R_i'}{Z_o}\right] * N/m \quad (3)$$

where $$|\beta(\omega)| = \left[\frac{\beta_o}{\sqrt{1 + \omega^2 * R_\pi^2 * C_\pi^2}}\right]$$

is the frequency dependent forward ac beta of the HBT transistor, $\beta_o$ is the ac beta at low frequencies, $R_i$ is defined as the input transmission line series resistance per unit length, and all the primed variables are normalized per unit length.

Equation (3m) indicates that the input line attenuation is heavily dependent on the parasitic resistances ($R_b$, $R_e$ and $R_\pi$) of the HBT transistor in addition to $R_i$. The first term in the brackets represents the attenuation due to the shunt conductance in parallel with the input capacitance $C_\pi$. The last term is the contribution of the series attenuation of the artificial transmission line. In HBT technology, the first term dominates the input line attenuation.

The output attenuation can also be expressed in a similar manner, except that it has contributions due to the relatively small HBT output shunt conductance of the device. The output line attenuation constant is given by:

$$\alpha_o \approx \frac{1}{2}\left[g_o' Z_o + \frac{R_o'}{Z_o}\right] * N/m \quad (4)$$

Figure 3A:
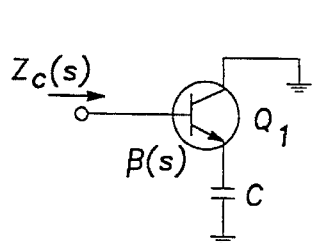
FIG. 3A is an electrical schematic of an active impedance transformation of a capacitance C at the emitter of a bipolar transistor.

The first term in the expression represents loss due to the output conductance go of the HBT and the second term represents the loss due to the series attenuation of the output transmission line. Although the output attenuation factor is relatively small compared to the input attenuation factor, it still impacts the maximum available gain at the output of the HBT distributed amplifier. Input and output transmission line attenuation due to the HBT device resistances limits gain bandwidth product and output power capability of HBT distributed amplifiers. For HBTs, the input attenuation compensation can be incorporated into the amplifying device configuration using an active impedance transformation. FIG. 3A illustrates a common-emitter device which actively transform is a capacitive impedance at the emitter in order to generate a negative impedance at the base (input). The HBT device transforms the capacitor at the emitter to an impedance at the base of $Q_1$ which looks like a capacitor C in parallel with a series negative resistance ($-\tau_T/C$) and negative capacitance ($-\alpha_o C$).

Figure 3B:
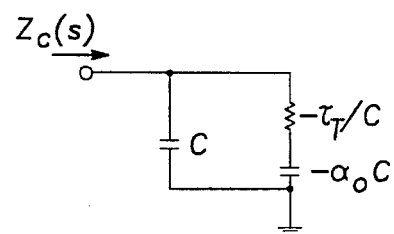
FIG. 3B is an equivalent circuit of FIG. 3A representing the transformed capacitive impedance.

The equivalent circuit representing the transformed capacitive impedance is illustrated in FIG. 3B. Adequate attenuation compensation can be obtained when the base and emitter resistances of the HBT are cancelled out by the negative resistance generated by the transformation. This results in an effective input impedance which has no real part. The effective input impedance is given by:

$$Z_b(s) = R_b + R_e(\beta(s) + 1) + r_\pi \| C_\pi + \frac{1}{\frac{1}{sC} + \frac{1}{\frac{-\tau_T}{C} - \frac{1}{S\alpha_o C}}} \quad (5)$$

Figure 4:
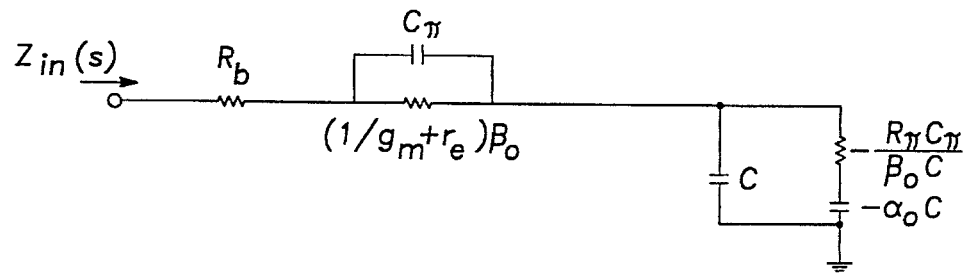
FIG. 4 is a schematic diagram of an equivalent circuit of the impedance looking into a base of a bipolar transistor.

The equivalent circuit of the input impedance is illustrated in FIG. 4. The capacitances C and $-\alpha_o C$ null each other out. The attenuation of the series resistive loss due to $R_b$ and $R_e$ can be cancelled out by the negative generated resistance:

$$R_{negative} = \frac{-\tau_T}{C} = \frac{R_\pi C_\pi}{\beta_o C} \quad (6)$$

By equating this resistance with the base and emitter resistance, the capacitance C required to cancel out the resistive attenuation due to $R_b$ and $R_e$ is therefore given by:

$$C \leq \frac{R_\pi C_\pi}{|\beta_o * (R_b + R_e)|} \quad (7)$$

This capacitance must be smaller than or equal to the term on the right hand side of equation (7) in order to overcome the additional losses due to the microstrip inductive components.

Figure 5A:
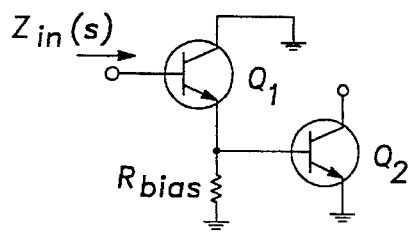
FIG. 5A is an electrical schematic of a practical implementation including a common-collector input transistor $Q_{cc}$ which actively transforms the input capacitance $C_\pi$ of the common-emitter transistor $Q_1$.
Figure 5B:
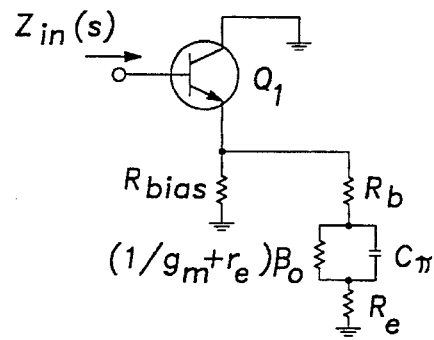
FIG. 5B is an electrical schematic similar to FIG. 5A and further including parasitic resistances of transistor $Q_1$.

In practice, a compact implementation of this technique can be realized by using a common-collector input transistor $Q_{cc}$ which transforms the input Capacitance $C_\pi$ of a common-emitter transistor $Q_1$ in FIG. 5A. Furthermore, by using a common-collector transistor at the input, the Miller input capacitance is reduced. The parasitic resistances of $Q_1$ and the shunt biasing resistance $R_{bias}$ will both contribute additional loss at the base of $Q_{cc}$. Thus, the actual impedance being transformed consists of a more complicated R-C network depicted in FIG. 5B, instead of an ideal capacitance element. Therefore the maximum capacitance value of equation (7) is overestimated. At this point, computer simulations are needed to optimize the size and bias of $Q_1$ in order to achieve an optimum broadband loss-less input impedance.

Output line attenuation compensation can be achieved using a cascode configuration instead of a common-emitter transistor. The cascode configuration helps increase the output resistance presented to the output transmission line and results in lower attenuation. The effective output resistance is increased by a factor of half the ac beta:

$$R_o = \frac{\beta_o * r_{o1}}{2} \quad (8)$$

In addition, the common-base transistor $Q_3$ of the cascode reduces the Miller capacitance of the common-emitter transistor, increasing the bandwidth. Although the cascode configuration improves the output resistance and bandwidth performance, it is also characteristically unstable for HBTs. In order to ensure circuit stability, feedback resistances and base bypass capacitance must be incorporated.

Figure 6:
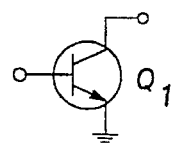
FIG. 6 illustrates a common-emitter transistor gain cell.
Figure 7:
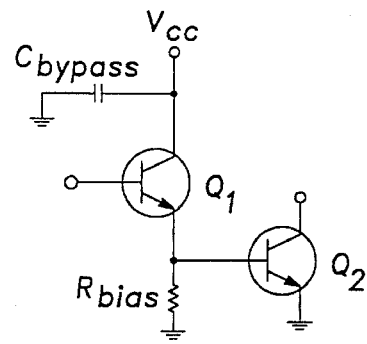
FIG. 7 illustrates an emitter-follower/common-emitter transistor gain cell.

For comparison, three gain cell configurations, the conventional common-emitter (CE), emitter-follower(common-collector)/common-emitter (CC-CE) and the emitter-follower(common-collector)/cascode (CC-cascode) configurations as shown in FIGS. 6, 7, and 8, respectively. In this work both input and output attenuation compensation techniques were combined into one bipolar transistor gain cell according to the invention and shown in FIG. 8. In a highly, preferred embodiment, the bipolar transistors 116, 134, and 140 are HBT transistors. In the following section, common-collector and emitter-follower will be referred to interchangeably. Negative feedback and a common-base bypassing network are used to stabilize the HBT cascode.

A gain cell 100 according to the invention and illustrated in FIG. 8 includes an input 110 and an output 114. Input 110 is connected to a base of a first bipolar transistor 116. A voltage source is connected to a node 118 which is connected to a collector of bipolar transistor 116. A bypass capacitor 120 is also connected to the collector of bipolar transistor 116. One end of a bias resistor 130 is connected to an emitter of bipolar transistor 116 and to a base of a second bipolar transistor 134. An opposite end of bias resistor 130 is connected to ground. An emitter of second bipolar transistor 134 is connected to ground. A collector of bipolar transistor 134 is connected to an emitter of a third bipolar transistor 140.

Output 114 is connected to a collector of third bipolar transistor 140 and to one end of a feedback resistor 144. An opposite end of feedback resistor is connected to a base of third bipolar transistor 140, a second bias resistor 150 and to one end of a bias capacitor 152. An opposite end of bias capacitor 152 is connected to one end of a third bias resistor 154. Opposite ends of bias resistors 150 and 154 are connected to ground.

Figure 9:
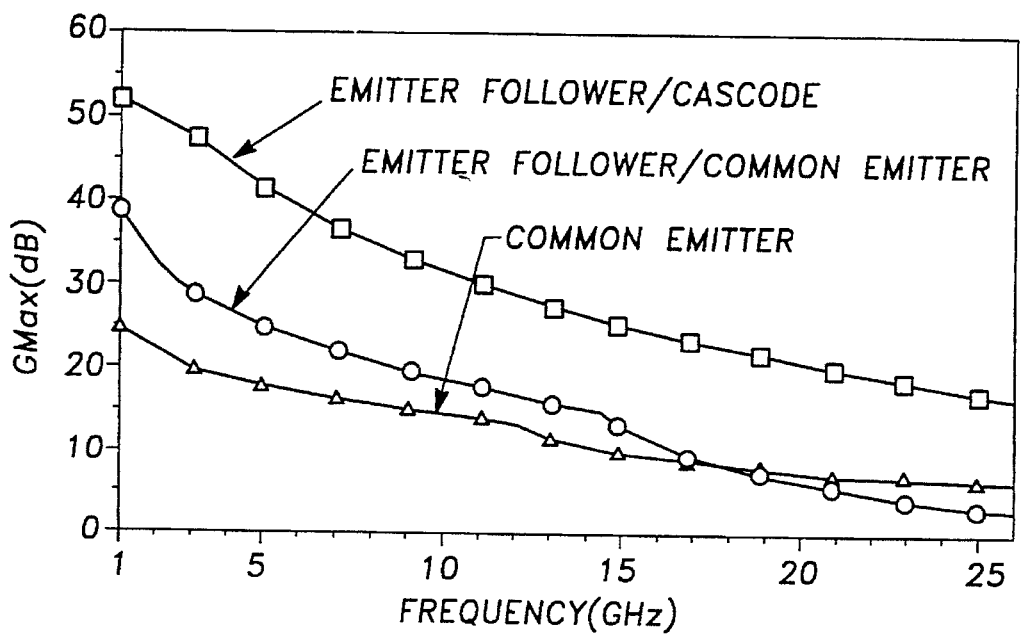
FIG. 9 illustrates gain as a function of frequency for the gain cells of FIGS. 6, 7 and 8.

The relative increase in gain performance of the present invention is shown in FIG. 9. This figure shows that the gain cell of FIG. 7 has ≈5–12 dB more gain than gain cell of FIG. 6 for frequencies <15 GHz. The gain of the gain cell 100 of FIG. 8 has a 12–20 dB improvement over the gain cell of FIG. 6 for frequencies up to 26 GHz. Thus, the gain cell 100 of FIG. 8 can offer more gain as well as bandwidth.

Figure 10:
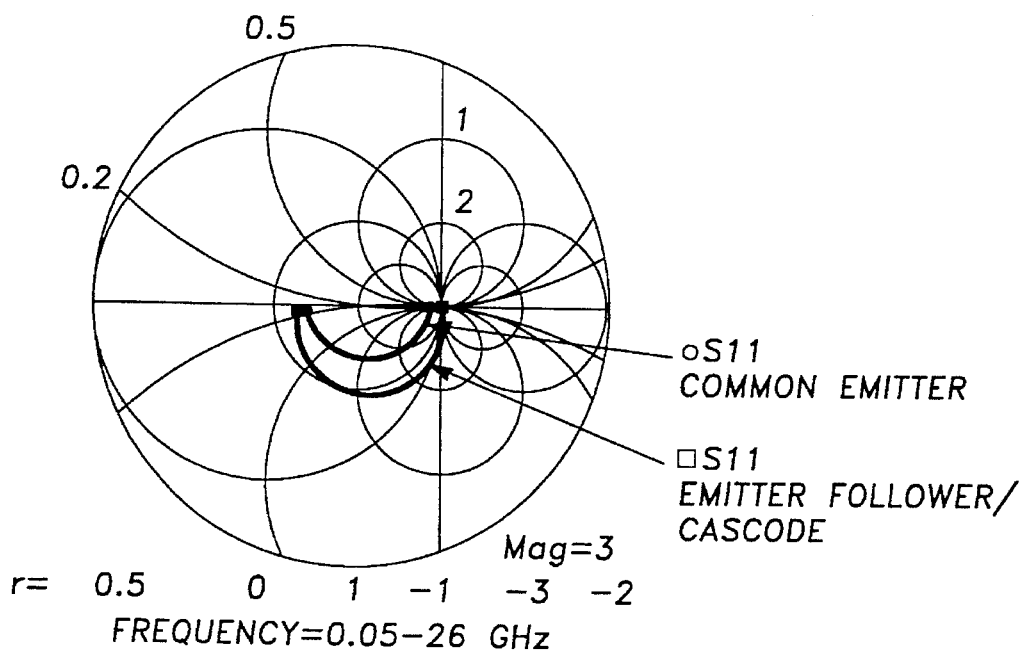
FIG. 10 illustrates input impedance ($S_{11}$) of the gain cell of FIG. 6 and the gain cell of FIG. 8.
Figure 11:
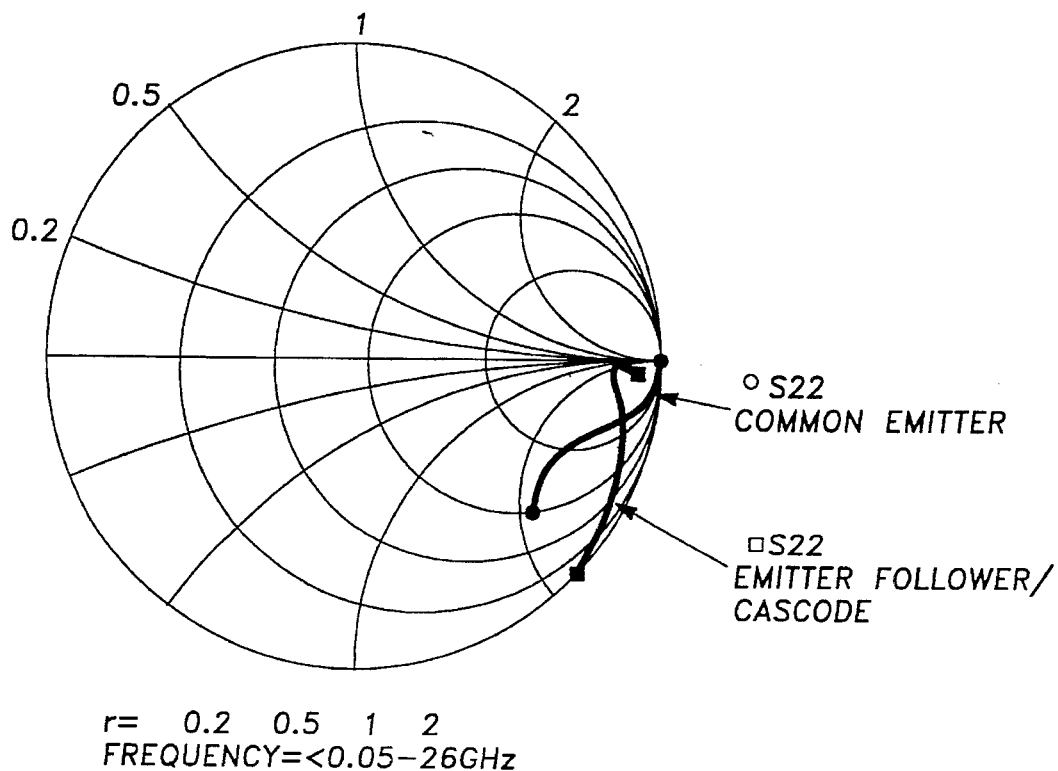
FIG. 11 illustrates output impedance ($S_{22}$) of the gain cell of FIG. 6 and the gain cell of FIG. 8.

The input and output characteristics of gain cell 100 of FIG. 8 are compared to the conventional gain cell of FIG. 6 in FIGS. 10 and 11. The input characteristics given by $S_{11}$ for gain cell 100 show that is has negative resistance at the upper frequencies. The $S_{11}$ of the gain cell of FIG. 6, on the other hand, is more lossy with a real impedance of >25 ohms over the band. The output characteristics of gain cell 100 have an output impedance $S_{22}$ which rapidly approaches a negative resistance at higher frequencies. The $S_{22}$ of the gain cell of FIG. 6 has a real impedance of a few hundred ohms at low frequencies and approaches 50 ohms at the high end. FIGS. 10 and 11 illustrate that the impedance transformations of the gain cell 100 due to the common-collector and common-base devices reduce the effective input and output resistive losses of the basic common-emitter transistor.

Figure 12:
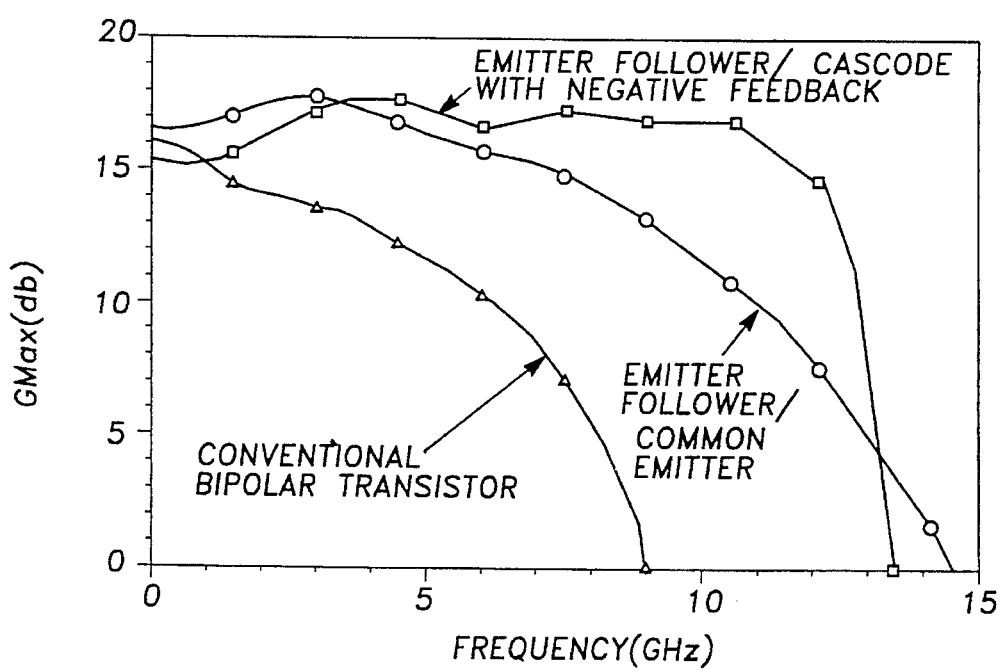
FIG. 12 illustrates wideband gain response of a distributed amplifier incorporating the gain cells of FIGS. 6, 7, and 8.

The simulated effect that the input and output attenuation techniques have on a 4-section HBT distributed amplifier design is shown in FIG. 12. FIG. 12 shows the wide band frequency response of the gain cell of FIG. 6 (common-emitter transistor), the gain cell of FIG. 7 (the emitter-follower/common-emitter transistor configuration), and the gain cell 100 (emitter-follower/cascode transistor configuration). FIG. 12 illustrates a 4 GHz, 8 GHz and 12 GHz 3-dB bandwidth for the three gain cells, respectively. The gain cell 100 provides a 200% improvement in gain-bandwidth (a 100% performance improvement due to input attenuation compensation technique and a 100% improvement due to the output attenuation and cascode gain compensation techniques).

The gain cell 100 (emitter-follower/cascode) is potentially unstable due to the instability of the HBT cascode. In order to improve the stability performance of the cell, negative feedback is implemented on the HBT cascode pair (FIG. 8) using resistors 144, 150, and 154 and capacitor 152.

Figure 13:
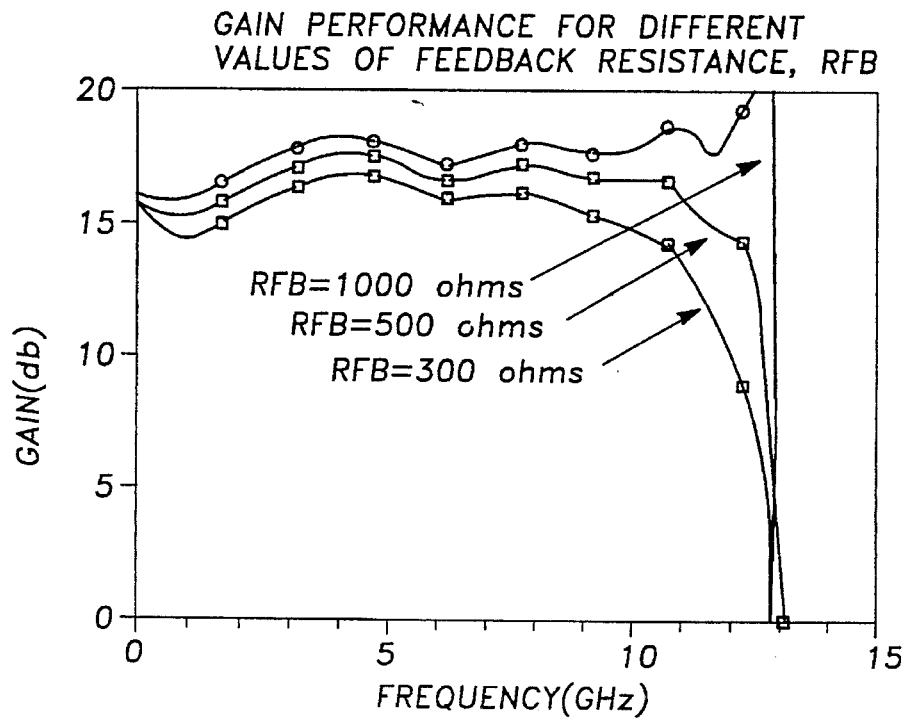
FIG. 13 illustrates gain and linear stability factor of a four section distributed amplifier employing the gain cell of FIG. 8 for different feedback resistances $R_{fb}$.
Figure 13:
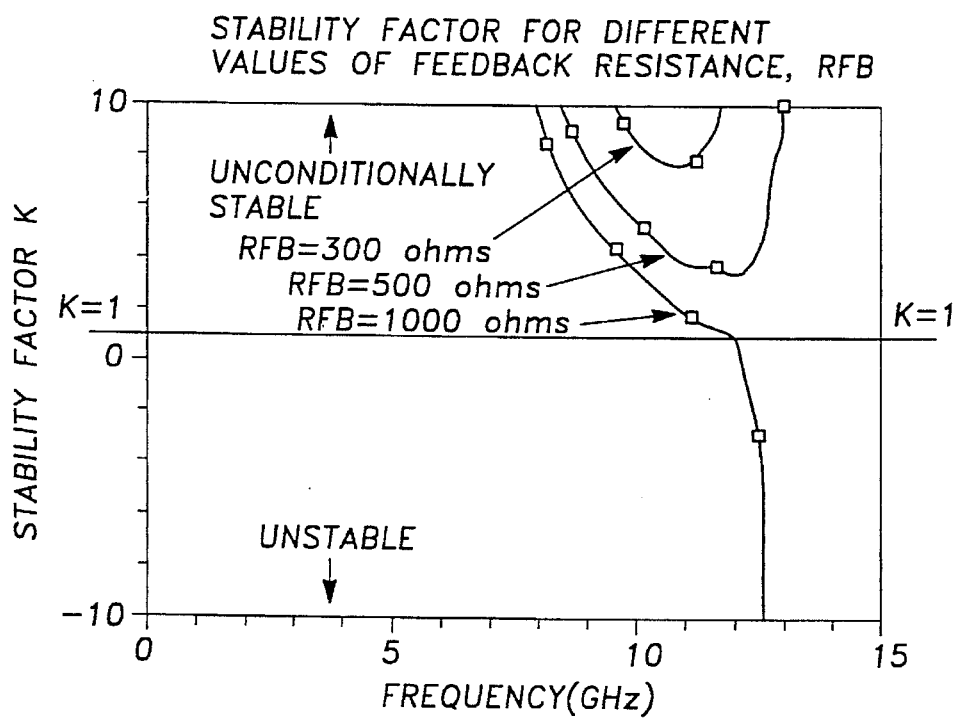

FIG. 13 shows the linear gain and K-factor stability performance of a 4-section HBT DA for various feedback resistance $R_{fb}$. The wideband gain response shows an excessive gain peaking at the upper band edge for a large feedback resistance of 1 k-ohm. The corresponding K-factor dips well below K=1, and does not recover. For a smaller feedback resistance, the gain peaking can be inhibited with corresponding K-factors greater than 2. In this manner, the shape of the gain run-off response and the K-factor stability margin can be selected to tolerate process variations and input power drive levels.

A 4-section HBT distributed amplifier using the emitter-follower/cascode HBT gain cell 100 was fabricated and measured. The configuration is implemented with $2 \times 10$ $\mu m^2$ single-emitter HBTs which operate at an Icc=4 mA for both the emitter-follower transistor, and the cascode transistor pair. The chip size is $3.5 \times 2.4$ $mm^2$, and the total power consumption is 160 mW. The wideband gain and input/output return-loss response are illustrated in FIG. 14. The nominal gain is 15 dB with a 3-dB bandwidth greater than 15 GHz. This translates into a gain bandwidth product (GBP) of 84 GHz. No instabilities were encountered during any of the measurements.

FIG. 15 shows the wideband IP3 performance. The IP3 was measured across the band under various bias conditions. For a total current of 48 mA, the IP3 at low frequencies is approximately 22 dBm and rolls-off to 17 dBm at the high band edge.

The gain cell 100 of FIG. 8 can be used in a wide variety of devices but finds particular utility for use with distributed amplifiers (DA) such as in a multi-section DA 200 shown in FIG. 17. DA 200 includes a signal input 201 and a signal output 202. An input transmission line 204 includes a plurality of inductive base elements $L_1$. Inductive base element $L_1'$ is coupled to an input inductive base element $L_{IN}$ which is coupled to signal input 201. Inductive base element $L_1''$ is coupled a first input load impedance $Z_{LIN1}$. An output transmission line 208 includes a plurality of inductive base elements $L_3$. Inductive collector element $L_3'$ is coupled to an output impedance $Z_{LOUT}$. An inductive base element $L_3''$ is coupled to signal output 202. Distributed amplifier 200 also includes a first plurality of stages $220_{A1}$, $220_{B1}$, $220_{C1}$, ... , $220_{N1}$. Each stage $220_{A1}$, $220_{B1}$, $220_{C1}$, ..., $220_{N1}$ includes a gain cell $240_{A1}$, $240_{B1}$, $240_{C1}$, ..., $240_{N1}$, respectively, with inductive base and collector elements $L_{A1}$, $L_{B1}$, $L_{C1}$, ..., $L_{N1}$ which connect the input and output thereof to input and output transmission lines 204 and 208. Inputs of adjacent stages 220 are separated by inductive base elements $L_1$ as shown in FIG. 17. For example, the input of stages $220_{A1}$ and $220_{B1}$ are separated by inductive base element $L_1'''$.

Outputs of adjacent stages 220 are separated by inductive base and collector elements $L_3$. For example, the output of stages $220_{A1}$ and $220_{B1}$ are separated by inductive base element $L_3'''$.

As can be appreciated, because of the lower input capacitance and compensation for resistive losses of the gain cells according to the invention, additional stages can be connected in FIG. 17 without corresponding loss of gain and/or bandwidth.

An input power splitter feeding a second 100Ω input transmission line 224 can be employed using broadband passive or active combiners/splitters 226. Second input transmission line 224 includes a plurality of inductive base elements $L_2$. Inductive base element $L_2'$ is coupled to input inductive base element $L_{IN}$ which, in turn, is coupled to signal input 201. Inductive base element $L_2''$ is coupled to input load impedance $Z_{LIN2}$. Distributed amplifier 200 can further include a plurality of stages $220_{A2}$, $220_{B2}$, $220_{C2}$, ..., $220_{N2}$ each including a gain cell $240_{A2}$, $240_{B2}$, $240_{C2}$, ..., $240_{N2}$ coupled by inductive base and collector elements $L_{A2}$, $L_{B2}$, $L_{C2}$, ..., $L_{N2}$ to input and output transmission lines 224 and 208. Each stage $220_{A2}$, $220_{B2}$, $220_{C2}$, $220_{N2}$ includes an inductive base element $L_2$ coupled between the input and the adjacent stage. For example, stages $220_{A2}$ and $220_{B2}$ include an inductive base element $L_2'''$ coupled between the inputs and inductive collector element $L_3'''$ between the outputs.

In use a signal transmitted to signal input 201 is split by combiner/splitter 226 onto first and second transmission lines 204 and 224. The first and second transmission lines 204 and 224 transmit the split input signal to each of the distributed gain cells 220. Each gain cell 240 amplifies the input signals and outputs the amplified signals to output transmission line 208. Output transmission line transmits a combined, amplified output signal to signal output 202.

As previously described above, each gain cell has lower input capacitance and compensation for resistive losses such that a significant number of additional stages can be added to increase the gain and output power without degrading the bandwidth.

FIG. 16 shows an alternate gain cell 300 similar to gain cell 100 of FIG. 8. Gain cell 300 further includes a bipolar transistor 310 having an emitter coupled to the base of the bipolar transistor 116 and a collector coupled to a voltage supply. A base bias network represented by resistor 314 has one end coupled to the base of bipolar transistor 310 and an opposite end coupled to a known voltage $V_b$. An optional bias resistor 320 can be coupled to the base of bipolar transistor 116. The gain cell 300 can be similarly connected in DA 200 of FIG. 17. In a highly preferred embodiment, transistors 116, 134, 140 and 310 can be HBT transistors. As can be appreciated, a capacitor 311 provides capacitive coupling on the input lines to decrease the effective input capacitance. In this way, larger devices may be implemented to achieve more output power without degrading the bandwidth performance. A reduction in effective linear gain will result, however, will not necessarily impact the overall efficiency. The base bias network (represented by resistor 314) for the multi-device cell is required to bias up the base of the bipolar transistor 310. This bias circuit can be easily replaced by a more robust temperature compensation circuit.

The gain cells 100 and 300 according to the invention compensate for the resistive losses at the input and output by employing active impedance transformations which generate broadband loss-less input and output impedances. HBTs are preferred for realizing the wideband power amplification because of its good frequency performance and high power added efficiency. The novel gain cells 100 and 300 can be employed in distributed amplifiers which achieve high gain-bandwidth product (GBP) per device. Multi-section DAs achieve a gain of 15 dB and a 3-dB bandwidth of >15 GHz. The resulting gain-bandwidth product is 84 GHz. When normalized to the device $f_T$, this DA achieves the highest normalized gain-bandwidth-product figure of merit for HBT DA's, ≈3.67, which is a 55% improvement over existing state-of-the-art performance. The novel gain cells 100 and 300 offer 15–20 dB more available gain for the device unit cell and results in a gain-bandwidth product improvement of 200% over a conventional common-emitter DA configuration.

Other objects, features and advantages will be readily apparent to the skilled practitioner after studying the foregoing description and following claims.

What is claimed is:

1. An electrical circuit comprising:

an amplifier including an amplifier input and an amplifier output;

a gain cell having low input and output losses at microwave frequencies due to input and output attenuation compensation of said gain cell, said gain cell being coupled between the amplifier input and the amplifier output for providing gain, said gain cell including:

input means, coupled to said amplifier input and including a common-collector bipolar transistor having a base coupled to said amplifier input, for reducing input capacitance and resistive losses at microwave frequencies; and output means, coupled to said amplifier output and including a common-base bipolar transistor in series with a common emitter bipolar transistor, for reducing output resistive losses at microwave frequencies, of said common-collector bipolar transistor defining an equivalent circuit according to the right hand side of the following relationship:

$$C \leq \frac{R_\pi C_\pi}{|\beta_o * (R_b + R_e)|}$$

wherein $R_\pi$ is a first parasitic resistance, $C_\pi$ is an input capacitance, $\beta_o$ is an ac beta at low frequencies, $R_b$ is a second parasitic resistance, $R_e$ is a third parasitic resistance, and wherein the size and bias of said common-emitter bipolar transistor, which determines an effective input capacitance of said common-emitter bipolar transistor, is defined by C.

2. The electrical circuit of claim 1 wherein the gain cell further comprises:

feedback means, associated with said output means, for stabilizing said gain cell wherein a collector of said common-base bipolar transistor is coupled to said amplifier output and wherein said feedback means includes a first feedback resistor having one end coupled to said collector of said common-base bipolar transistor and an opposite end coupled to a base of said common-base bipolar transistor, a second feedback resistor connected between said base of said common-base bipolar transistor and ground, and a third feedback resistor and a feedback capacitor connected in parallel to said second feedback resistor.

3. The electrical circuit of claim 2 wherein said amplifier is a distributed amplifier including a first input transmission line and an output transmission line, and a first plurality of said gain cells each having said input means coupled to said input transmission line and said output means coupled to said output transmission line;

whereby said input means and said output means of each of said plurality of gain cells permit an increased number of gain cells without degrading gain and bandwidth performance.

4. The electrical circuit of claim 3, wherein said first input transmission line includes a plurality of inductive elements separating each said input means of said plurality of gain cells.

5. The electrical circuit of claim 3 wherein said distributed amplifier further includes a second input transmission line and a splitting means for splitting an input signal between said first and second input transmission lines.

6. The electrical circuit of claim 5 further comprising a second plurality of said gain cells each having said input means coupled to said second input transmission line and said output means coupled to said output transmission line.

7. The electrical circuit of claim 6 wherein said first plurality of gain cells and said second plurality of gain cells include the same number of gain cells;

wherein an output means of a first gain cell of said first plurality of gain cells is coupled to an output means of a first gain cell of said second plurality of gain cells and to said output transmission line; and wherein an output means of a second gain cell of said first plurality of gain cells is coupled to an output means of a second gain cell of said second plurality of gain cells and to said output transmission line.

8. The electrical circuit of claim 7 wherein said first and second input transmission lines and said output transmission lines include a first and second input terminating impedance and an output terminating impedance.

9. The electrical circuit of claim 2 wherein an emitter of said common-collector bipolar transistor is coupled to a base of said common-emitter bipolar transistor and to a bias resistor.

10. A bipolar transistor gain cell having low input and output losses at microwave frequencies due to input and output attenuation compensation, comprising:

an input;

a first bipolar transistor having a base, a collector, and an emitter, wherein said base is coupled to said input;

a second bipolar transistor having a base, a collector and an emitter, wherein said emitter of said first bipolar transistor is coupled to said base of said second bipolar transistor;

a third bipolar transistor connected to said second bipolar transistor in a cascode configuration; and an output coupled to a collector of said third bipolar transistor;

wherein the equivalent circuit of said first bipolar transistor defines the right hand side of the following relationship:

$$C \leq \frac{R_{\pi} C_{\pi}}{|\beta_o * (R_b + R_e)|}$$

wherein $R_\pi$ is a first parasitic resistance, $C_\pi$ is an input capacitance, $\beta_o$ is an ac beta at low frequencies, $R_b$ is a second parasitic resistance, $R_e$ ms a third parasitic resistance, and wherein the size and bias of said common-emitter bipolar transistor, which determines an effective input capacitance of said common-emitter bipolar transistor, is defined by C.

11. The bipolar transistor gain cell of claim 10 wherein said first, second and third bipolar transistors are heterojunction bipolar technology transistors.

12. The bipolar transistor gain cell of claim 10 further comprising:

a first bias resistor having one end coupled to said base of said second bipolar transistor and an opposite end coupled to ground.

13. The bipolar transistor gain cell of claim 12 wherein said first bias resistor provides a current sink for said first bipolar transistor.

14. The bipolar transistor gain cell of claim 10 further comprising:

feedback means coupled to at least one of a base and a collector of said third bipolar transistor for stabilizing said second bipolar transistor and said third bipolar transistor.

15. The bipolar transistor gain cell of claim 14 wherein said feedback means includes a feedback resistor having a first end coupled to said collector of said third bipolar transistor and an opposite end coupled to said base of said third bipolar transistor.

16. The bipolar transistor, gain cell of claim 15 wherein said feedback means further includes a second bias resistor having a first end coupled to said base of said third bipolar transistor and an opposite end coupled to ground.

17. The bipolar transistor gain cell of claim 16 wherein said second bias resistor provides partial voltage bias to said base of said third bipolar transistor.

18. The bipolar transistor gain cell of claim 16 wherein said feedback means further includes:

a biasing capacitor having one end coupled so said base of said third bipolar transistor; and a third bias resistor having one end coupled to an opposite end of said biasing capacitor and an opposite end coupled to ground.

19. The bipolar transistor gain cell of claim 18 wherein said biasing capacitor and said third bias resistor bypass said base of said third bipolar transistor to allow common base operation, and wherein said third bias resistor provides impedance at said base of said third bipolar transistor to allow said feedback resistor to provide negative feedback.

20. The bipolar transistor gain cell of claim 10 wherein said collector of said first bipolar transistor is coupled to a voltage source.

21. The bipolar transistor gain cell of claim 10 further comprising:

a fourth bipolar transistor having an emitter coupled to said base of said first bipolar transistor and a collector coupled to a voltage source.

22. The bipolar transistor gain cell of claim 21 further comprising:

a base resistor having one end coupled to a base of said fourth bipolar transistor and an opposite end coupled to a predetermined voltage.

23. The bipolar transistor gain cell of claim 22 further comprising:

a fourth bias resistor having one end coupled to said base of said first bipolar transistor and an opposite end coupled to ground.

24. A bipolar transistor gain cell distributed amplifier which operates at microwave frequencies comprising:

first, second, and output transmission lines; and first, second, third and fourth bipolar transistor gain cells having low input and output losses at microwave frequencies due to input and output attenuation compensation at said gain cells, each including an input and an output, a first, second and third bipolar transistor each having a base, a collector and an emitter, wherein said input is coupled to said base of said first bipolar transistor, said second and said third bipolar transistor are connected in a cascode configuration, said emitter of said first bipolar transistor is coupled to said base of said second bipolar transistor, and said output is coupled to said collector of said third bipolar transistor;

wherein components of the equivalent circuit of said first bipolar transistor define the right hand side of the following relationship:

$$C \leq \frac{R_\pi C_\pi}{|\beta_o * (R_b + R_e)|}$$

wherein $R_\pi$ is a first parasitic resistance, $C_\pi$ is an input capacitance, $\beta_o$ is an ac beta at low frequencies $R_b$ is a second parasitic resistance, $R_e$ is a third parasitic resistance, and wherein the size and bias of said common-emitter bipolar transistor, which determines an effective input capacitance of said common-emitter bipolar transistor, is defined by C;

wherein said inputs of said first and third bipolar transistor gain cells are coupled to said first transmission line, and said inputs of said second and fourth bipolar transistor gain cells are coupled to said second transmission line; and wherein said outputs of said first, second, third and fourth bipolar transistor gain cells are connected to said output transmission line.

25. The bipolar transistor gain cell distributed amplifier of claim 24 wherein said first, second, third and fourth bipolar transistor gain cells include:

a first bias resistor having one end coupled to said base of said second bipolar transistor and an opposite end of said first bias resistor is coupled to ground.

26. The bipolar transistor gain cell distributed amplifier of claim 24 wherein said first, second, third and fourth bipolar transistor gain cells include:

a feedback resistor having one end coupled to said collector of said third bipolar transistor and opposite end coupled to said base of said third bipolar transistor.

27. The bipolar transistor gain cell distributed amplifier of claim 24 wherein said first, second, third and fourth bipolar transistor gain cells include:

a second bias resistor having one end coupled to said base of said third bipolar transistor and an opposite end coupled to ground.

28. The bipolar transistor gain cell distributed amplifier of claim 24 wherein said first, second, third and fourth bipolar transistor gain cells include:

a biasing capacitor having one end coupled to said base of said third bipolar transistor; and a third bias resistor having one end coupled to an opposite end of said biasing capacitor and an opposite end coupled to ground.

29. The bipolar transistor gain cell distributed amplifier of claim 24 wherein said first, second, third and fourth bipolar transistor gain cells include:

a fourth bipolar transistor having a base, an emitter and a collector, wherein said emitter of said fourth bipolar transistor is coupled to said base of said first bipolar transistor.

30. The bipolar transistor gain cell distributed amplifier of claim 29 wherein said first, second, third and fourth bipolar transistor gain cells include:

a base resistor having one end coupled to said base of said fourth bipolar transistor and an opposite and coupled to a predetermined voltage.

31. The bipolar transistor gain cell distributed amplifier of claim 30 wherein said first, second, third and fourth bipolar transistor gain cells include:

a fourth bias resistor having one end coupled to said base of said first bipolar transistor and an opposite end coupled to ground.

* * * * *